United States Patent
Yang et al.

(10) Patent No.: US 6,492,239 B2
(45) Date of Patent: Dec. 10, 2002

(54) METHOD FOR FABRICATING AVALANCHE PHOTODIODE

(75) Inventors: Seung-Kee Yang, Seoul (KR); Dong-Soo Bang, Seoul (KR)

(73) Assignee: Samsung Electronic Co, LTD, Suwon (KR)

( * ) Notice: Subject to any disclaimer, the term of this patent is extended or adjusted under 35 U.S.C. 154(b) by 39 days.

(21) Appl. No.: 09/839,930

(22) Filed: Apr. 20, 2001

(65) Prior Publication Data

US 2002/0001911 A1 Jan. 3, 2002

(30) Foreign Application Priority Data

Jun. 29, 2000  (KR) ............................................. 00-36371

(51) Int. Cl.⁷ .......................... H01L 21/20; H01L 21/00
(52) U.S. Cl. ........................... 438/380; 438/45; 438/91; 438/93; 438/94; 438/559
(58) Field of Search ................................. 438/91, 93, 94, 438/45, 98, 83, 559, 548, 554, 558, 380

(56) References Cited

U.S. PATENT DOCUMENTS

| | | | | |
|---|---|---|---|---|
| 3,601,888 A | * | 8/1971 | Engeler et al. | 438/537 |
| 4,569,123 A | * | 2/1986 | Ishii et al. | 438/368 |
| 4,651,187 A | * | 3/1987 | Sugimoto et al. | 257/186 |
| 4,656,494 A | * | 4/1987 | Kobayashi et al. | 257/186 |
| 4,684,969 A | * | 8/1987 | Taguchi | 257/148 |
| 4,761,383 A | * | 8/1988 | Matsushima et al. | 438/91 |
| 4,876,209 A | * | 10/1989 | Forrest | 438/91 |
| 4,906,583 A | * | 3/1990 | Kagawa et al. | 438/91 |
| 4,992,386 A | * | 2/1991 | Furuyama et al. | 438/91 |
| 5,001,335 A | * | 3/1991 | Takaoka et al. | 257/199 |
| 5,098,851 A | * | 3/1992 | Ito et al. | 438/57 |
| 5,114,866 A | * | 5/1992 | Ito et al. | 438/87 |
| 5,132,747 A | * | 7/1992 | Matsushima et al. | 257/438 |
| 5,144,381 A | * | 9/1992 | Furuyama et al. | 257/438 |
| 5,179,430 A | * | 1/1993 | Torikai | 257/186 |
| 5,672,541 A | * | 9/1997 | Booske et al. | 438/513 |

FOREIGN PATENT DOCUMENTS

| | | | | |
|---|---|---|---|---|
| JP | 61191082 A | * | 8/1986 | H01L/31/10 |
| JP | 61220481 A | * | 9/1986 | H01L/31/10 |

OTHER PUBLICATIONS

Ackley et al., "In/Sub 0.53/Ga/Sub 0.47/ As/InP Floating Guard Ring Avalanche Photdiodes Fabricated by Double Diffusion", IEEE Photonics Technology Letters, Aug. 1990, pp. 571–573.*

Liu et al., "A Planar InP/InGaAs Avalanche Photodiode with Floating Guard Ring and Double Diffused Junction", Journal of Lightwave Technology, Feb. 1992. pp. 182–193.*

(List continued on next page.)

*Primary Examiner*—Matthew Smith
*Assistant Examiner*—Lex H. Malsawma
(74) *Attorney, Agent, or Firm*—Steve Cha; Cha & Reiter

(57) ABSTRACT

An avalanche photodiode fabricating method with a simplified fabrication process and an improved reproducibility is disclosed. The method for fabricating an avalanche photodiode includes the steps of: (a) sequentially stacking, on an n-type InP substrate, an, InP buffer layer, an InGaAs absorption layer, an n-type InGaAsP grading layer, an n-type InP current adjusting layer, and an InP amplifying layer; (b) forming a protection layer on the InP amplifying layer, etching a light-receiving area of the protection layer and the InP amplifying layer to a predetermined depth, and partially etching the protection layer to expose a FGR forming area of the InP amplifying layer; (c) diffusing a diffusion source in the etched light-receiving area and the exposed FGR forming area; (d) forming a reflection suppressing layer on the diffusion layer formed on the light-receiving area by diffusing the diffusion source, the FGR layer and the exposed amplifying layer; (e) forming an upper electrode layer to a predetermined depth from the reflection suppressing layer to the diffusion layer formed on the light-receiving area; and, (f) forming a lower electrode layer on a back of the substrate.

6 Claims, 7 Drawing Sheets

OTHER PUBLICATIONS

Cho et al., "Suppression of Avalanche Multiplication at the Periphery of Diffused Junction by Floating Guard Rings in a Planar InGaAs–InP Avalanche Photodiode", IEEE Photonics Technology Letters, May 2000, pp. 534–536.*

Vanhollebeke et al., "MOVPE based Zn diffusion into InP and InAsP/InGaAs heterostructures", IEEE International Symp. on Compound Semiconductors, Oct. 2–5, 2000, pp. 205–210.*

* cited by examiner

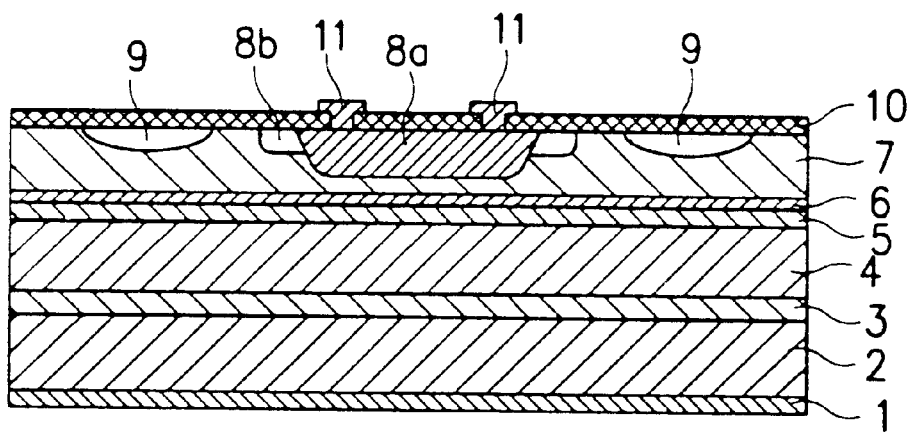
FIG. 1 [PRIOR ART]
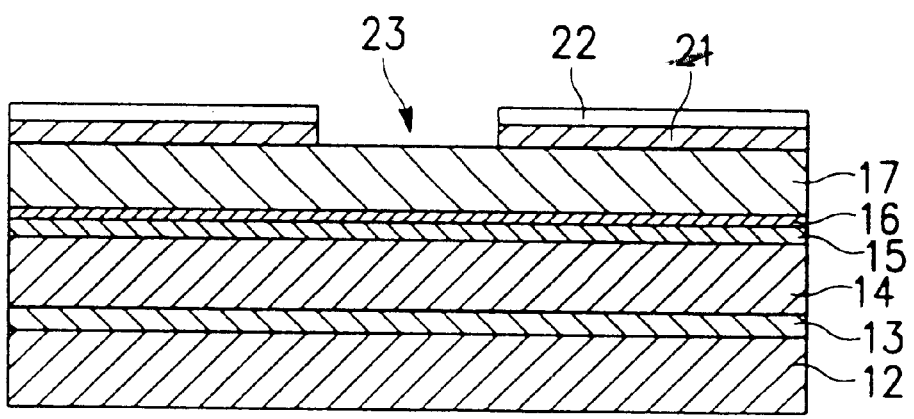
FIG. 2

METHOD FOR FABRICATING AVALANCHE PHOTODIODE

CLAIM OF PRIORITY

This application makes reference to and claims all benefits accruing under 35 U.S.C. Section 119 from an application entitled, "Method for Fabricating Avalanche Photodiode," filed in the Korean Industrial Property Office on Jun. 29, 2000 and there duly assigned Ser. No. 2000-36371.

BACKGROUND OF THE INVENTION

1. Field of the Invention

The present invention relates generally to a method for fabricating an avalanche photodiode. More particularly, the present invention relates to a method for fabricating an avalanche photodiode utilizing a more simplified process, thereby improving a reproducibility of the avalanche photodiode.

2. Description of the Related Art

Recently, an avalanche photodiode (APD) is widely used for application in a high-speed optical communication of over 2.5 Gbps. In order to transmit a large amount of information at a transfer rate of over 2.5 Gbps, many researches are currently being conducted to improve and increase the transfer rate.

However, the efforts to increase the transfer rate of the optical communication system leads to an increase in the transmission noises, thus decreasing the receiving sensitivity of the system. In a long-distance optical communication system, the transmission power of an optical signal is decreased due to a power loss in the optical fiber as the transmission distance gets longer. In this type of optical communication system, a Pin (P/intrinsic/n-type conductive) photodiode is typically used as an optical receiver to receive data at a rate of up to 10 Gbps. Having no internal gain, the Pin photodiode can achieve a receiving sensitivity of below −20 dBm. Here, the "receiving sensitivity" refers to the receiver capability of processing an optical signal without error. That is, if an optical signal is transmitted to a remote distance through an optical fiber at an initial power level of 1 mW and received at the destination end at a power level of over 10 $\mu$W, the signal is considered received within an acceptable error margin.

In contrast, an avalanche photodiode exhibits a higher receiving sensitivity by virtue of its internal gain. For example, the receiving sensitivity of the avalanche photodiode with an internal gain 10 is higher by −30 dBm when compared to the Pin photodiode under the same prevailing conditions. As a consequence, the optical communication system employing the avalanche photodiode as an optical receiver can transmit the optical signal due to more sensitive receiving capability.

The avalanche photodiode, as described in the preceding paragraph, is illustrated in FIG. 1. As shown in FIG. 1, an avalanche photodiode includes a stacked structure of a lower electrode layer 1, an n-type InP substrate 2, an InP buffer layer 3, an InGaAs absorption layer 4, an n-type InGaAs grading layer 5, an n-type InP current adjusting layer 6, and an InP amplifying layer 7 in succession. In addition, a primary diffusion layer 8a and a secondary diffusion layer 8b are formed at the central of the amplifying layer 7. An FGR (Floating Guard Ring) layer 9 is formed at the edge of the amplifying layer 7. The reference numeral 10 indicates a reflection suppressing layer, and the reference numeral 11 indicates an upper electrode layer.

Normally, the avalanche photodiode has a very high operating voltage applied to its diffusion boundary, i.e., a p-n junction formed between the amplifying layer 7 and the primary and secondary diffusion layers 8a and 8b. In particular, if the diffusion boundary has a curvature shape, the current density per unit area increases. Thus, the device may be subject to a breakdown at a lower voltage when compared with a flat diffusion boundary area. Hence, in order to decrease the current density around the primary diffusion layer 8a, the secondary diffusion layer 8b is formed to have a smaller diffusion depth at the edges than the center area. In addition, the FGR layer 9 can obtain a desired gain without a breakdown by changing the distribution of its internal electric field to decrease the strength of an electric field applied between the primary diffusion layer 8a serving as a light-receiving surface and the absorption layer 4. That is, if the FGR layer 9 is formed away from the secondary diffusion layer 8b, the depletion layer extends to the edges of the secondary diffusion layer 8b according to the operating voltage. Meanwhile, if the depletion layer reaches the FGR layer 9, the current density is decreased. As a result, it is possible to increase the operating voltage, thus making it possible to obtain a high internal gain.

Conventionally, in order to manufacture such an avalanche photodiode as described above, the central part of the amplifying layer 7 is etched to a predetermined depth, then the primary diffusion layer 8a is formed in the etched area by a primary diffusion process. Next, the secondary diffusion layer 8b and the FGR layer 9 are formed around the primary diffusion layer 8a by a secondary diffusion process. However, this conventional fabrication method requires the diffusion process to perform several times, thereby increasing the fabrication complexity. Furthermore, the primary diffusion layer 8a formed in the primary diffusion process is diffused again due to the heat applied from the secondary diffusion process, thus making it difficult to accurately control the diffusion depth of the primary diffusion layer 8a. As a consequence, it is not possible to guarantee the reproducibility of the same photodiode.

SUMMARY OF THE INVENTION

In the preferred embodiment, the present invention provides an avalanche photodiode fabricating method that is simpler and enables reproducibility of the photodiode.

According to a preferred embodiment, a method of fabricating an avalanche photodiode is provided and includes the steps of: (a) sequentially stacking, in succesion, on an n-type InP substrate, an InP buffer layer, an InGaAs absorption layer, an n-type InGaAsP grading layer, an n-type InP current adjusting layer, and an InP amplifying layer; (b) forming a protection layer on the InP amplifying layer, etching a light-receiving area of the protection layer and the InP amplifying layer to a predetermined depth, and partially etching the protection layer to expose a FGR forming area of the InP amplifying layer; (c) diffusing a diffusion source in the etched light-receiving area and the exposed FGR forming area; (d) forming a reflection suppressing layer on the diffusion layer formed on the light-receiving area by diffusing the diffusion source, the FGR layer and the exposed amplifying layer; (e) forming an upper electrode layer to a predetermined depth from the reflection suppressing layer to the diffusion layer formed on the light-receiving area; and (f) forming a lower electrode layer on a back of the substrate.

The step (b) comprises the steps of primarily etching the light-receiving area of the protection layer and the InP amplifying layer to a predetermined depth by dry etching; and, secondarily etching a boundary etched in the primary etching process by wet etching to relieve a curvature of the etched boundary.

The step (c) comprises the steps of forming the diffusion source layer on the etched light-receiving area and the exposed FGR forming area; forming a diffusion suppressing layer on the diffusion source layer; diffusing the diffusion source into the amplifying layer at a predetermined temperature; and, removing the diffusion suppressing layer.

Preferably, the diffusion source comprises $Zn_3$, and the diffusion suppressing layer is a $SiO_2$ layer.

BRIEF DESCRIPTION OF THE DRAWINGS

The above features and advantages of the present invention will become more apparent from the following detailed description when taken in conjunction with the accompanying drawings in which:

FIG. 1 is a cross-sectional view illustrating a structure of a conventional avalanche photodiode; and FIGS. 2 to 13 are cross-sectional views illustrating a process for manufacturing an avalanche photodiode in sequence in accordance with an embodiment of the present invention.

DETAILED DESCRIPTION OF THE PREFERRED EMBODIMENT

Figure 3:
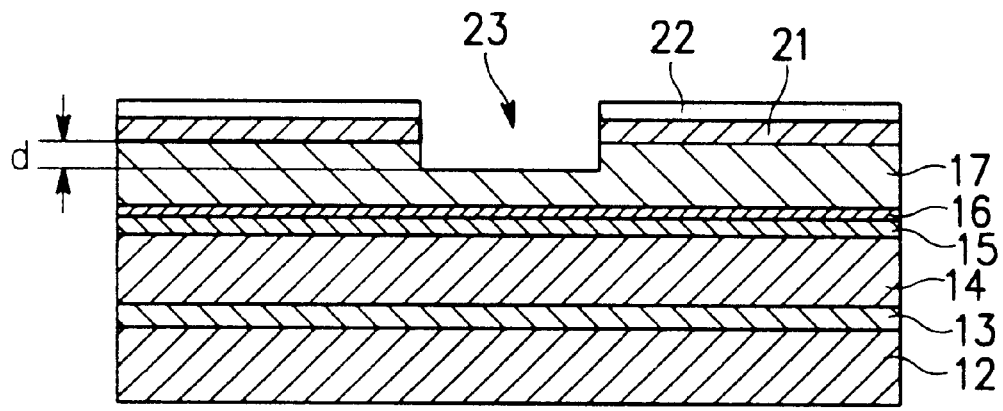

A preferred embodiment of the present invention will be described herein below with reference to the accompanying drawings. For the purpose of clarity, well-known functions or constructions are not described in detail as they would obscure the invention in unnecessary detail.

Referring to FIG. 2, an InP buffer layer 13, an InGaAs absorption layer 14, an n-type InGaAsP grading layer 15, an n-type InP current adjusting layer 16, and an InP amplifying layer 17 are sequentially stacked on an n-type substrate 12. Here, the InP buffer layer 13 is formed to reduce lattice mismatch between the n-type InP substrate 12 and the InGaAs absorption layer 14. The n-type InGaAsP grading layer 15 or a speed-up layer is formed to increase a response speed in responding to the reception of the light.

Next, protection layers 21 and 22 are formed on the amplifying layer 17. Preferably, the protection layer 21 is a $SiN_x$ (e.g., $Si_3N_4$) layer, and the protection layer 22 is a photoresist layer.

Thereafter, the protection layers 21 and 22 are partially removed by a photolithography technique. to expose a prescribed surface of the amplifying layer 17 where the light-receiving area 23 is to be formed. The exposed area of the amplifying layer 17 is then primarily etched to a predetermined depth "d", as illustrated in FIG. 3. Since wet etching process has different etching rates and the post-etching topography process depends on the crystal orientation, it is preferred that the primary etching process is performed by a dry etching process so that the etched portion has a cylindrical topography. As the dry etching process enables an anisotropic etching, which is independent of the crystal orientation, it is possible to vertically etch the amplifying layer 17 to a desired depth. Here, the dry etching uses mixture gas of CH and $H_2$, or $BCl_3$ gas as etching gas.

Figure 4:
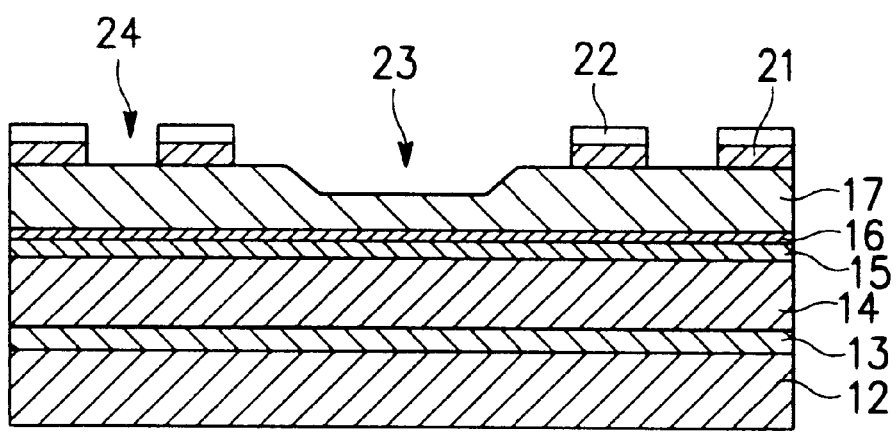

After the primary etching process, a prescribed area 24 of the protection layers 21 and 22 where an FGR layer 27 is to be formed, is etched out by a photolithography technique (see FIG. 4).

Thereafter, as illustrated in FIG. 4, a curvature of the vertical boundary etched in the primary etching process is relieved (or decreased) through a secondary etching process for which a wet etching is used. If the vertical boundary formed in the primary etching process remains unrelieved, the current density is increased at the rectangular vertexes during operation, thereby lowering the breakdown voltage of the device. Therefore, in the embodiment of the present invention, the curvature of the etched boundary is relieved through the secondary etching process.

Subsequently, a diffusion layer 28 and an FGR layer 27 are simultaneously formed in the light-receiving area 23 and the FGR forming area 24, respectively, through a single diffusion process for which a thin-film diffusion process is used (see FIG. 8).

Figure 5:
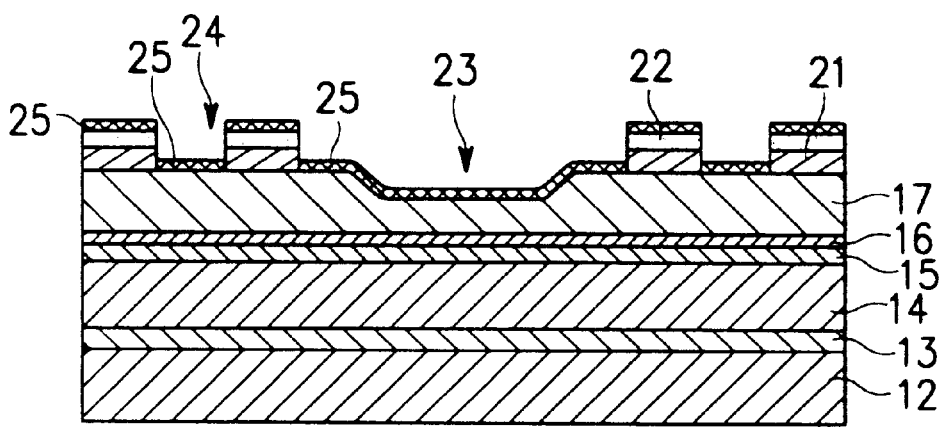
Figure 6:
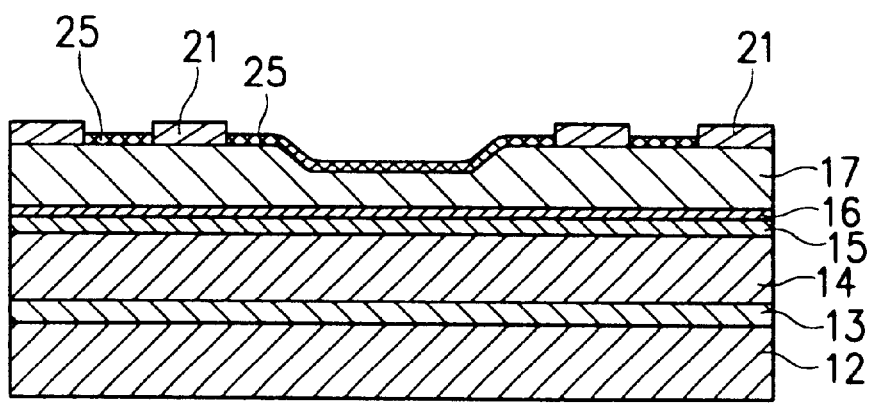
Figure 7:
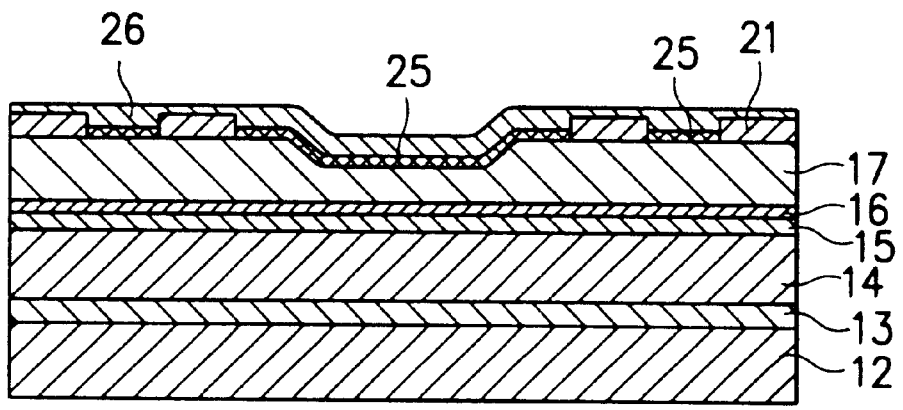

That is, as shown in FIG. 5, a diffusion source layer 25 made of, for example, $Zn_3P_2$ is deposited on the light-receiving area 23 and the FGR forming area 24. Thereafter, as shown in FIG. 6, the photoresist layer 22 is removed by a lift-off operation, then a $SiO_2$ diffusion suppressing layer 26 is formed on the diffusion source layer 25, as illustrated in FIG. 7. The diffusion suppressing layer 26 suppresses (or prevents) the diffusion source from vaporizing during the succeeding diffusion process, thereby increasing the efficiency of diffusion into the amplifying layer 17.

Figure 8:
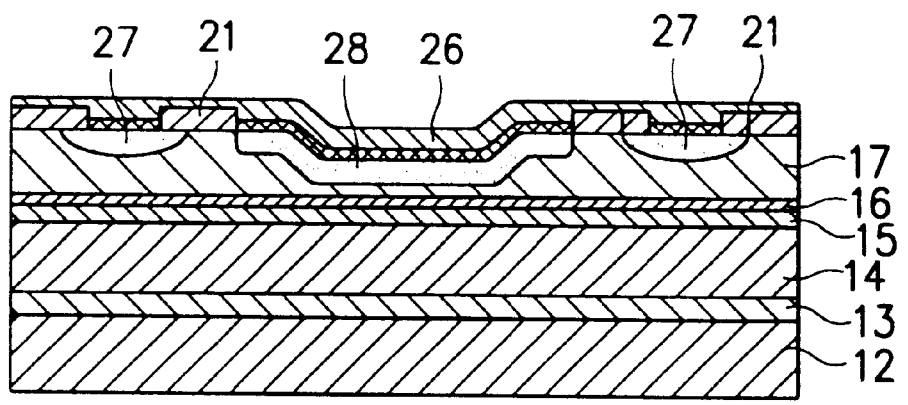

Thereafter, the diffusion source is diffused into the amplifying layer 17 by a rapid thermal annealing (RTA) technique at about 500° C., thereby simultaneously forming the FGR layer 27 and the p-type diffusion layer 28 (see FIG. 8).

Figure 9:
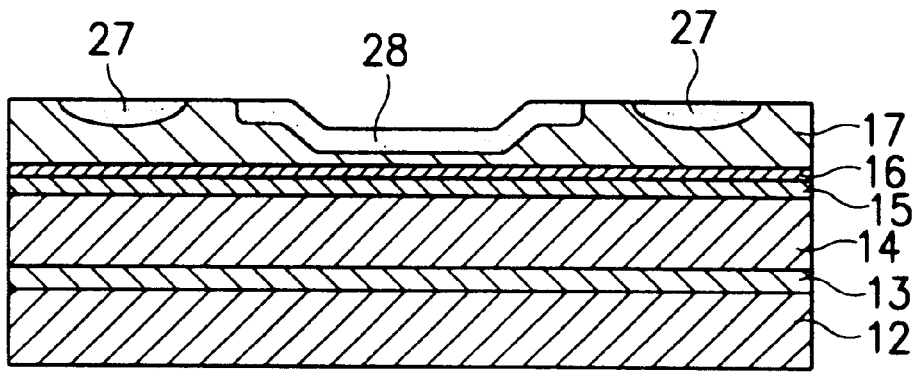
Figure 10:
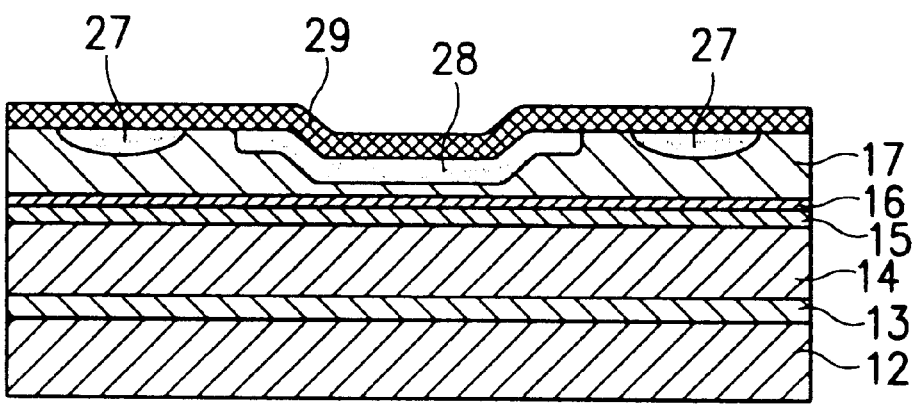

Subsequently, the diffusion suppressing layer 26 is removed (see FIG. 9), then a reflection suppressing layer 29 is formed on the amplifying layer 17 by a PECVD (Plasma Enhanced Chemical Vapor Deposition) technique, as shown in FIG. 10.

Figure 11:
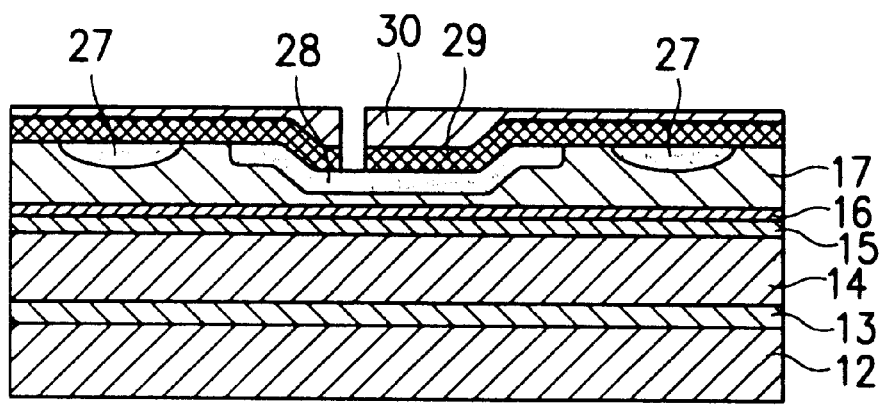
Figure 12:
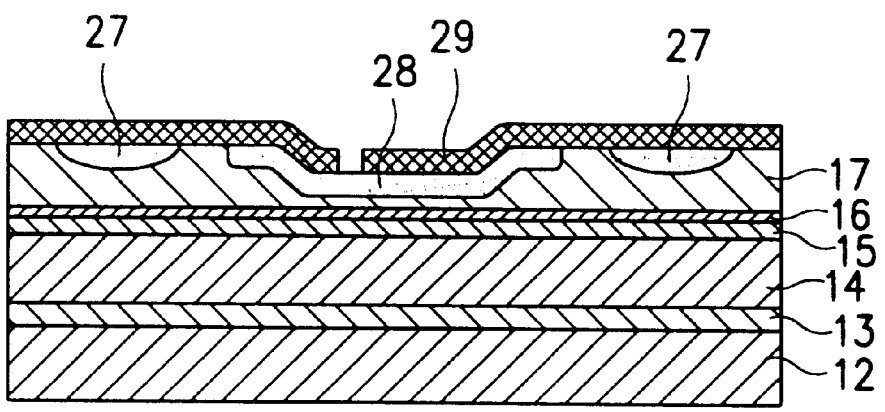
Figure 13:
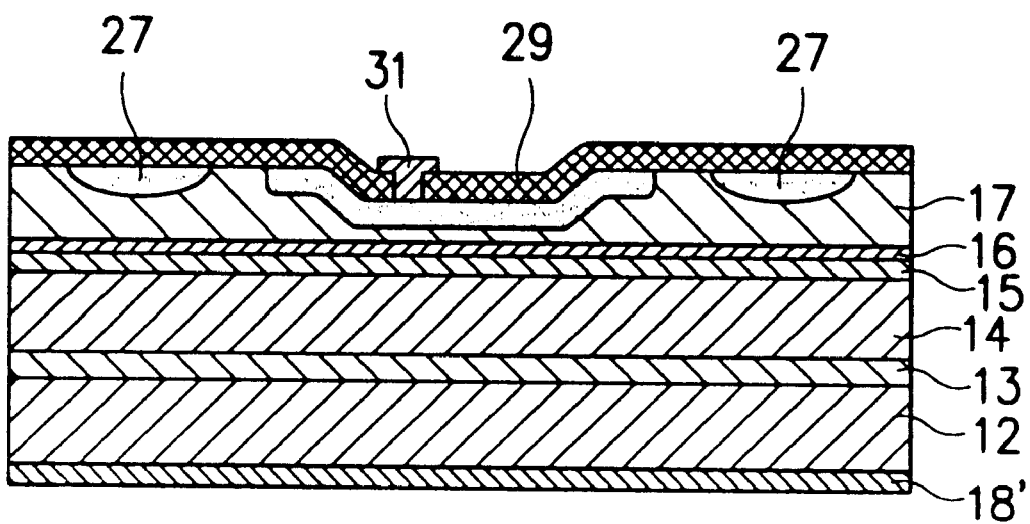

In the preliminary process for forming an upper electrode 31, a photoresist layer 30 is formed on the reflection suppressing layer 29. Then, a prescribed area of the photoresist layer 30 and the reflection suppressing layer 29 where the upper electrode layer 31 is to be formed, is etched to a prescribed width by a photolithography technique to expose the diffusion layer 28 (see FIG. 11). Thereafter, as illustrated in FIG. 12, the photoresist layer 30 is removed and then the p-type metal is filled into the etched area to form the T-shaped upper electrode layer 31. Thereafter, an AuGe/Ni/Au lower electrode layer 18 is formed on the back of the substrate 12, thereby completing the avalanche photodiode shown in FIG. 13.

As described above, the avalanche photodiode manufacturing method according to an embodiment of the present invention has the following advantages.

First, the light-receiving area and the FGR forming area are formed through a single diffusion process, thus simplifying the manufacturing process.

Second, it is possible to accurately control the diffusion depth as the diffusion process is performed only once, thus increasing the reproducibility and the yield.

Third, as the primary etching process for forming the diffusion layer is performed through a dry etching technique, it is possible to obtain a desired etching pattern regardless of the crystal orientation. The curvature of the boundary etched in the primary dry etching is relieved through the secondary wet etching, thus increasing the reproducibility.

While the invention has been shown and described with reference to a certain preferred embodiment thereof, it will be understood by those skilled in the art that various changes in form and details may be made therein without departing from the spirit and the scope of the invention as defined by the appended claims.

What is claimed is:

1. A method for fabricating an avalanche photodiode, the method comprising the steps of:

(a) sequentially stacking, on an n-type InP substrate, an InP buffer layer, an InGaAs absorption layer, an n-type InGaAsP grading layer, an n-type InP current adjusting layer, and an InP amplifying layer;

(b) forming a protection layer on the InP amplifying layer, etching a light receiving area of the protection layer and the InP amplifying layer to a predetermined depth, and partially etching the protection layer to expose a FGR forming area of the InP amplifying layer;

(c) diffusing a diffusion source in the etched light-receiving area and the exposed FGR forming area;

(d) forming a reflection suppressing layer on the diffusion layer formed on the light-receiving area by diffusing the diffusion source, the FGR layer, and the exposed amplifying layer;

(e) forming an upper electrode layer to a predetermined depth from the reflection suppressing layer to the diffusion layer that is formed on the light-receiving area; and, (f) forming a lower electrode layer on the back of the substrate.

2. The method as claimed in claim 1, wherein the step (b) comprises the steps of:

primarily etching the light-receiving area of the protection layer and the InP amplifying layer to a predetermined depth by a dry etching operation; and, secondarily etching a boundary etched in the primary etching process by a wet etching operation to relieve a curvature of the etched boundary.

3. The method as claimed in claim 1 wherein the protection layer is formed on the amplifying layer and comprises an Si layer, and wherein the protection layer is a photoresist layer.

4. The method as claimed in claim 1, wherein the step (c) comprises the steps of:

forming the diffusion source layer on the etched light-receiving area and the exposed FGR forming area;

forming a diffusion suppressing layer on the diffusion source layer;

diffusing the diffusion source into the amplifying layer at a predetermined temperature; and, removing the diffusion suppressing layer.

5. The method as claimed in claim 4, wherein the diffusion source comprises $Zn_3$.

6. The method as claimed in claim 4, wherein the diffusion suppressing layer is a $SiO_2$ layer.

* * * * *